(12) United States Patent
Lee et al.

(10) Patent No.: US 10,453,983 B2
(45) Date of Patent: Oct. 22, 2019

(54) SOLAR CELL AND METHOD OF MANUFACTURING

(71) Applicant: LG ELECTRONICS INC., Seoul (KR)

(72) Inventors: Kyoungsoo Lee, Seoul (KR);
Sangwook Park, Seoul (KR);
Jinhyung Lee, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 15/381,529

(22) Filed: Dec. 16, 2016

(65) Prior Publication Data

US 2017/0179332 A1 Jun. 22, 2017

(30) Foreign Application Priority Data

Dec. 18, 2015 (KR) .................. 10-2015-0181745
Nov. 21, 2016 (KR) .................. 10-2016-0155176

(51) Int. Cl.
*H01L 31/068* (2012.01)
*H01L 31/0224* (2006.01)
(Continued)

(52) U.S. Cl.
CPC .... *H01L 31/0682* (2013.01); *H01L 31/02167* (2013.01); *H01L 31/02363* (2013.01); *H01L 31/02366* (2013.01); *H01L 31/022433* (2013.01); *H01L 31/022466* (2013.01); *H01L 31/022475* (2013.01);
(Continued)

(58) Field of Classification Search
CPC ............. Y02E 10/50; H01L 31/022466; H01L 31/02363; H01L 31/02167; H01L 31/0682
See application file for complete search history.

(56) References Cited

U.S. PATENT DOCUMENTS

2009/0215218 A1 8/2009 Meier et al.
2010/0095866 A1* 4/2010 Schreiber ................ C09D 7/61
106/286.6

(Continued)

FOREIGN PATENT DOCUMENTS

CN 102074593 A 5/2011
CN 103907205 A 7/2014
(Continued)

*Primary Examiner* — Lindsey A Bernier
(74) *Attorney, Agent, or Firm* — Birch, Stewart, Kolasch & Birch, LLP (57) ABSTRACT

Disclosed herein are a solar cell and a method of manufacturing the same. The solar cell module includes a semiconductor substrate, a first passivation film located on a front surface of the semiconductor substrate, a second passivation film located on a rear surface of the semiconductor substrate, a front electric field region located on the first passivation film on the front surface of the semiconductor substrate and being of a same conductivity-type as that of the semiconductor substrate, an emitter region located on the second passivation film on the rear surface of the semiconductor substrate and being of a conductivity-type opposite that of the semiconductor substrate, first electrodes conductively connected to the front electric field region, and second electrode conductively connected to the emitter region.

15 Claims, 7 Drawing Sheets

(51) Int. Cl.
- *H01L 31/0236* (2006.01)
- *H01L 31/0216* (2014.01)
- *H01L 31/072* (2012.01)
- *H01L 31/18* (2006.01)
- *H01L 31/074* (2012.01)
- *H01L 31/0747* (2012.01)

(52) U.S. Cl.
CPC .... *H01L 31/022483* (2013.01); *H01L 31/072* (2013.01); *H01L 31/074* (2013.01); *H01L 31/0747* (2013.01); *H01L 31/18* (2013.01); *H01L 31/1884* (2013.01); *Y02E 10/50* (2013.01)

(56) References Cited

U.S. PATENT DOCUMENTS

| | | | | |
|---|---|---|---|---|
| 2011/0303278 A1* | 12/2011 | Fu | .................... | H01L 31/02167 136/256 |
| 2012/0305060 A1* | 12/2012 | Fu | .................... | H01L 31/0747 136/255 |
| 2013/0171767 A1* | 7/2013 | Moslehi | ............ | H01L 21/26586 438/89 |
| 2016/0225931 A1* | 8/2016 | Heng | .................. | H01L 31/18 |
| 2016/0329443 A1* | 11/2016 | Wang | .............. | H01L 31/022466 |

FOREIGN PATENT DOCUMENTS

| | | |
|---|---|---|
| CN | 104350607 A | 2/2015 |
| CN | 104393114 A | 3/2015 |
| JP | 2005-101239 A | 4/2005 |
| JP | 2010-41032 A | 2/2010 |
| JP | 2011-61197 A | 3/2011 |
| JP | 2015-73058 A | 4/2015 |
| JP | 2015-84348 A | 4/2015 |
| KR | 10-2014-0105064 A | 9/2014 |
| KR | 10-1459650 B1 | 11/2014 |
| KR | 10-2015-0022372 A | 3/2015 |
| KR | 10-2015-0104431 A | 9/2015 |
| WO | WO 2014/148499 A1 | 9/2014 |

* cited by examiner

SOLAR CELL AND METHOD OF MANUFACTURING

CROSS-REFERENCE TO RELATED APPLICATIONS

This application claims the priority benefit of Korean Patent Application No. 10-2015-0181745, filed on Dec. 18, 2015, and No. 10-2016-0155176, filed on Nov. 21, 2016 in the Korean Intellectual Property Office, the disclosures of which are incorporated herein by reference.

BACKGROUND OF THE INVENTION

Field of the Invention

Embodiments of the present invention relate to a solar cell and a method of manufacturing the same and, more particularly, to a solar cell having an improved structure and a method of manufacturing the same.

Description of the Related Art

Recently, as exhaustion of conventional energy sources, such as oil and coal, is expected, interest in alternative energy as a substitute for such energy increases. There among, solar cells are spotlighted as a next generation battery which converts solar energy into electric energy.

Such a solar cell may be manufactured by forming various layers and electrodes according to design. Efficiency of the solar cell may be determined by design of the various layers and electrodes. In order to commercialize solar cells, low efficiency of the solar cells should be overcome and, thus, design to maximize efficiency of a solar cell through various layers and electrodes is required.

SUMMARY OF THE INVENTION

An object of the present invention is to provide a solar cell which has high efficiency and a method of manufacturing the same.

The objects of the embodiments of the present invention are not limited to the above-mentioned objects and other objects that have not been mentioned above will become evident to those skilled in the art from the following description.

To achieve the above objects, there is provided a solar cell according to an example embodiment of the present invention, including a semiconductor substrate, a first passivation film located on a front surface of the semiconductor substrate, a second passivation film located on a rear surface of the semiconductor substrate, a front electric field region located on the first passivation film on the front surface of the semiconductor substrate and being of a same conductivity-type as that of the semiconductor substrate, an emitter region located on the second passivation film on the rear surface of the semiconductor substrate and being of a conductivity-type opposite that of the semiconductor substrate, first electrodes conductively connected to the front electric field region, and second electrode conductively connected to the emitter region.

To achieve the above objects, there is provided a method of manufacturing a solar cell according to an example embodiment of the present invention, including forming a first passivation film and a second passivation film on front and rear surfaces of a semiconductor substrate, forming a front electric field region located on the first passivation film on the front surface of the semiconductor substrate and being of a same conductivity-type as that of the semiconductor substrate, and an emitter region located on the second passivation film on the rear surface of the semiconductor substrate and being of a conductivity-type opposite that of the semiconductor substrate, forming a first transparent electrode layer located on the front electric field region and a second transparent electrode layer located on the emitter region, and forming a first metal electrode layer located on the first transparent electrode layer and a second metal electrode layer located on the second transparent electrode layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. While the invention will be described in conjunction with example embodiments, it will be understood that the present description is not intended to limit the invention to the example embodiments.

In the drawings, in order to clearly and briefly describe the invention, parts which are not related to the description will be omitted, and the same reference numbers will be used throughout the drawings to refer to the same or like parts. Further, in order to more clearly describe the invention, thicknesses, areas, etc., of elements may be enlarged or reduced and thus the thicknesses, areas, etc., of the elements are not limited to the drawings.

In the following description of the embodiments, the term "including" will be interpreted as indicating the presence of other elements, unless stated otherwise, and does not exclude presence of the corresponding elements. In addition, it will be understood that when an element, such as a layer, a film, a region or a plate, is referred to as being "on" another element, it can be directly on the element, and one or more intervening elements may also be present therebetween. It will be understood that when an element, such as a layer, a film, a region or a plate, is referred to as being "directly on" another element, no intervening elements are present therebetween.

Hereinafter, a solar cell in accordance with one embodiment of the present invention will be described in detail with reference to the accompanying drawings.

Figure 1:
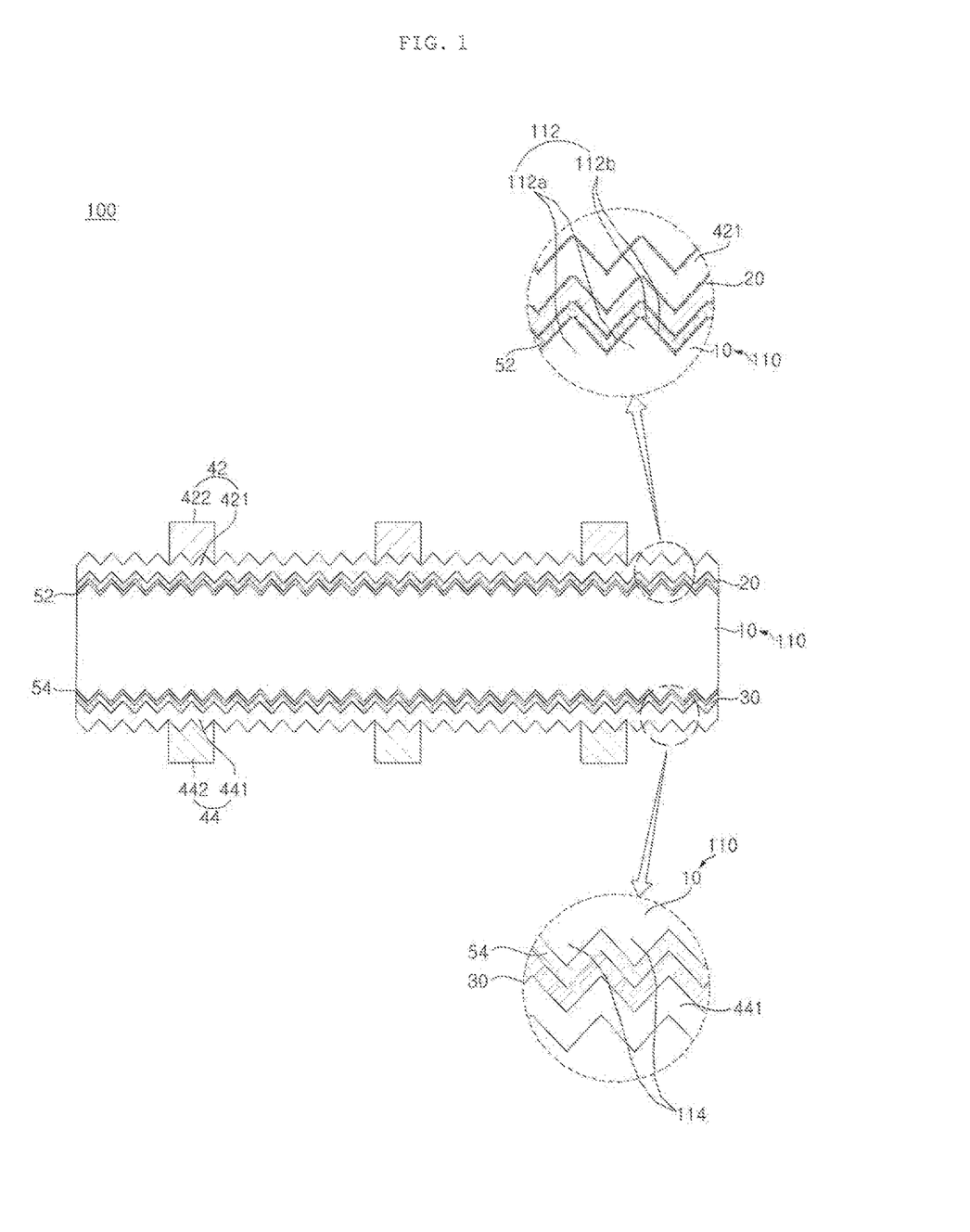
FIG. 1 is a cross-sectional view of a solar cell in accordance with one embodiment of the present invention.

FIG. 1 is a cross-sectional view of a solar cell in accordance with one embodiment of the present invention.

With reference to FIG. 1, a solar cell 100 in accordance with this embodiment includes a semiconductor substrate 110 including a base region 10, a first passivation film 52 formed on the front surface of the semiconductor substrate 110, a second passivation film 54 formed on the rear surface of the semiconductor substrate 110, a front electrical field region 20 formed on the first passivation film 52 on the front surface of the semiconductor substrate 110, an emitter region 30 formed on the second passivation film 54 on the rear surface of the semiconductor substrate 110, first electrodes 42 conductively connected to the front electrical field region 20, and second electrodes 44 conductively connected to the emitter region 30. This will be described in more detail.

The semiconductor substrate 110 may be formed of a crystalline semiconductor. For example, the semiconductor substrate 110 may be formed of a monocrystalline or polycrystalline semiconductor (for example, monocrystalline or polycrystalline silicon). Particularly, the semiconductor substrate 110 may be formed of a monocrystalline semiconductor (for example, a monocrystalline semiconductor wafer and, more particularly, a monocrystalline silicon wafer). If the semiconductor substrate 110 is formed of a monocrystalline semiconductor (for example, monocrystalline wafer), the solar cell 100 becomes a monocrystalline semiconductor solar cell (for example, a monocrystalline silicon solar cell). The solar cell 100 based on the semiconductor substrate 110 formed of a crystalline semiconductor having high crystallinity and thus having few defects has excellent electrical characteristics.

In this embodiment, the semiconductor substrate 110 may have no doped region and include only the base region 10. If the semiconductor substrate 110 has no doped region, damage to and increase in defects on the semiconductor substrate 110, which may be generated when a doped region is formed, may be prevented and thus the semiconductor substrate 110 may have excellent passivation characteristics. Thereby, surface recombination occurring on the surface of the semiconductor substrate 110 may be minimized.

In this embodiment, the semiconductor substrate 110 or the base region 10 may be doped with a base dopant, i.e., a first conductivity-type dopant, at a low doping concentration, thus having a first conductivity type. In this instance, the semiconductor substrate 110 or the base region 10 may have a lower doping concentration, a higher resistance or a lower carrier concentration than the front electric field region 20 having the same conductivity type.

At least one of the front surface and the rear surface of the semiconductor substrate 110 may have unevennesses 112 and 114 so as to prevent or reduce reflection. In more detail, in this embodiment, the unevennesses 112 and 114 may include first unevenness 112 formed on the front surface of the semiconductor substrate 110 (or a surface at the side of the front surface of the semiconductor substrate 110) and second unevenness 114 formed on the rear surface of the semiconductor substrate 110 (or a surface at the side of the rear surface of the semiconductor substrate 110). Thereby, reflection of light incident upon both the front and rear surfaces of the semiconductor substrate 110 may be prevented or reduced, and optical loss in the solar cell 100 having a bi-facial light-receiving structure as in this embodiment may be effectively reduced. However, the disclosure is not limited thereto, and any one of the first unevenness 112 and the second unevenness 114 may be formed.

The first unevenness 112 located on the front surface of the semiconductor substrate 110 may include first uneven parts 112a and second uneven parts 112b so as to minimize optical loss. The second uneven parts 112b may be formed on the first uneven parts 112a, in more detail, on the outer surfaces of the first uneven parts 112a, and have a smaller size than the first uneven parts 112a. Therefore, the mean size of the second uneven parts 112b may be smaller than the mean size of the first uneven parts 112a, and at least one second uneven part 112b, for example, a plurality of second uneven parts 112b, may be formed on each of the outer surfaces of the first uneven parts 112a. Such first uneven parts 112a and second uneven parts 112b may be formed through different methods.

The first uneven parts 112a may be formed through a texturing process. Thereby, the outer surfaces of the first uneven parts 112a may be specific crystalline surfaces. For example, the first uneven parts 112a may have an approximately pyramid shape formed by four outer surfaces 111.

The mean size of the first uneven parts 112a (for example, the mean value of the heights of the first uneven parts 112a) may be on the micrometer-level (for example, 1 μm to 1 mm) and, for example, be about 10 μm to 30 μm. If the mean size of the first uneven parts 112a is less than 10 μm, it may be difficult to manufacture the first uneven parts 112a and, if the mean size of the first uneven parts 112a is 30 μm or less, reflection prevention effects may be improved. Further, a variation in the sizes of the first uneven parts 112a may be a first variation which is relatively large. The first uneven parts 112a may be formed by anisotropic etching which is a type of wet etching. If the first uneven parts 112a are formed by wet etching, the first uneven parts 112a may be formed through a simple process within a short period of time.

The second uneven parts 112b may be formed on the outer surfaces of the first uneven parts 112a and have a fine size. The second uneven parts 112b may have pointed tips. However, the disclosure is not limited thereto and the second uneven parts 112b may have rounded tips.

The mean size of the second uneven parts 112b (for example, the mean value of the heights of the second uneven parts 112b) may be on the nanometer-level (i.e., 1 μm or less, for example, 1 nm to 1 μm) and, for example, be about 100 nm to 500 nm. If the second uneven parts 112b having a smaller size than the first uneven parts 112a are formed on the first uneven parts 112a, reflection prevention effects may be improved. If the mean size of the second uneven parts 112b is less than 100 nm, it may be difficult to manufacture the second uneven parts 112b and, if the mean size of the second uneven parts 112b is 500 nm or less, reflection prevention effects may be further improved. A variation in the sizes of the second uneven parts 112b may be a second variation which is smaller than the first variation. The reason for this is that the mean size of the second uneven parts 112b is smaller than that of the first uneven parts 112a and the second uneven parts 112b are formed by isotropic etching. As described above, in this embodiment, uniform second uneven parts 112b having a fine size are formed on the outer surfaces of the first uneven parts 112a.

The second uneven parts 112b may be formed by isotropic etching which is a type of dry etching. As the dry etching, reactive ion etching (RIE) may be used. According to RIE, fine and uniform second uneven parts 112b may be formed. The disclosure is not limited to the above-described shape, mean size and size variation of the second uneven parts 112b, and the shape, mean size and size variation of the second uneven parts 112b may be variously modified.

In this embodiment, the second unevenness 114 formed on the rear surface of the semiconductor substrate 110 may include first uneven parts 114a. The description of the first uneven parts 112a of the first unevenness 112 may be applied to the first uneven parts 114a of the second unevenness 114, and a detailed description of the first uneven parts 114a may thus be omitted. If the second unevenness 114 of the semiconductor substrate 110 includes only the first uneven parts 114a unlike the first unevenness 112 including the first and second uneven parts 112a and 112b, reflection of light from the front surface of the semiconductor substrate 110, on which a large amount of light is incident, may be effectively prevented by the first unevenness 112 and moreover the second unevenness 114 may have a simple structure, thereby simplifying the manufacturing process of the solar cell 100.

However, the disclosure is not limited thereto. The first unevenness 112 formed on the front surface of the semiconductor substrate 110 may exclude at least one of the first uneven parts 112a and the second unevenness 114. Various other modifications are possible.

The first passivation film 52 is formed on the front surface of the semiconductor substrate 110, and the second passivation film 54 is formed on the rear surface of the semiconductor substrate 110. Thereby, the front and rear surfaces of the semiconductor substrate 110 may be passivated.

Although, in the specification, the terms "first passivation film 52" and "second passivation film 54" are used, at least one of the first passivation film 52 and the second passivation film 54 may serve as tunneling films. That is, the first and second passivation films 52 and 54 may act as a kind of barrier to electrons and holes and thus not pass minority carriers, but may pass only majority carriers accumulated at regions adjacent to the first and second passivation films 52 and 54 and having energy of a designated intensity or more. In this instance, the majority carriers having energy of the designated intensity or more may easily pass through the first and second passivation films 52 and 54 by a tunneling effect. In this instance, in order to sufficiently achieve the tunneling effect, the thicknesses of the passivation films 52 and 54 may be less than those of the front electric field region 20 and the emitter region 30.

For example, the first and second passivation films 52 and 54 may have an intrinsic amorphous semiconductor. For example, the first and second passivation films 52 and 54 may be formed of an intrinsic amorphous silicon (i-a-Si) layer. Then, since the first and second passivation films 52 and 54 include the same semiconductor material as the semiconductor substrate 110 and thus have similar characteristics to those of the semiconductor substrate 110, surface characteristics of the semiconductor substrate 110 may be more effectively improved. Thereby, passivation characteristics may be greatly improved. However, the disclosure is not limited thereto. Therefore, at least one of the first and second passivation films 52 and 54 may include an intrinsic amorphous silicon carbide (i-a-SiCx) layer or the first and second passivation films 52 and 54 may include an intrinsic amorphous silicon oxide (i-a-SiOx) layer. Thereby, effects of a wide energy bandgap may be improved, but passivation effects may be slightly lower than in the passivation films 52 and 54 including an intrinsic amorphous silicon (i-a-Si) layer.

In this instance, the first and second passivation films 52 and 54 may be formed on the entire front and rear surfaces of the semiconductor substrate 110. Thereby, the entireties of the front and rear surfaces of the semiconductor substrate 110 may be passivated, and the first and second passivation films 52 and 54 may be easily formed without separate patterning.

The front electric field region 20 of the first conductivity type may be formed on the first passivation film 52. Further, the emitter region 30 of a second conductivity-type opposite the first conductivity type may be formed on the second passivation film 54.

The front electric field region 20 may include a first conductivity-type dopant and thus be a first conductivity-type region. The emitter region 30 may include a second conductivity-type dopant and thus be a second conductivity-type region. For example, the front electric field region 20 may contact the first passivation film 52, and the emitter region 30 may contact the second passivation film 54. Thereby, the structure of the solar cell 100 may be simplified and the tunneling effect of the first and second passivation films 52 and 54 may be maximized. However, the disclosure is not limited thereto.

Since the front electric field region 20 and the emitter region 30 are formed above the semiconductor substrate 110 separately from the semiconductor substrate 110, the front electric field region 20 and the emitter region 30 may include at least one of materials and crystalline structures different from those of the semiconductor substrate 110 so as to be easily formed above the semiconductor substrate 110.

For example, the front electric field region 20 and the emitter region 30 may be formed by doping an amorphous semiconductor, which may be easily manufactured by various methods including deposition, with first and second conductivity-type dopants. Thereby, the front electric field region 20 and the emitter region 30 may be easily formed through a simple process. In this instance, if the first and second passivation films 52 and 54 are formed of an intrinsic amorphous semiconductor (for example, intrinsic amorphous silicon), as described above, excellent adhesiveness, excellent electrical conductivity, etc., may be acquired.

In this embodiment, the energy bandgap of the front electric field region 20 may be greater than the energy bandgap of the semiconductor substrate 110. Similarly, the energy bandgap of the emitter region 30 may be greater than the energy bandgap of the semiconductor substrate 110. Thereby, energy band bending is sufficiently carried out and thus selective collection of holes or electrons may be effectively executed.

Further, p-type dopants used as the first or second conductivity-type dopant may include III-group elements, such as boron (B), aluminum (Al), gallium (Ga), indium (In), etc., and n-type dopants include V-group elements, such as phosphorus (P), arsenic (As), bismuth (Bi), antimony (Sb), etc. However, the disclosure is not limited thereto and various dopants may be used as the first or second conductivity-type dopant.

For example, the semiconductor substrate 110 and the front electric field region 20 of the first conductivity-type may be of an n-type, and the emitter region 30 may be of a p-type. Thereby, the semiconductor substrate 110 is of the n-type and, thus, the life time of carriers may be improved. In this instance, the semiconductor substrate 110 and the front electric field region 20 may include phosphorus (P) as an n-type dopant, and the emitter region 30 may include boron (B) as a p-type dopant. However, the disclosure is not limited thereto, and the semiconductor substrate 110 and the front electric field region 20 of the first conductivity-type may be of a p-type, and the emitter region 30 may be of an n-type.

In this embodiment, the front electric field region 20 and the emitter region 30 may include at least one of an amorphous silicon (a-Si) layer, an amorphous silicon oxide (i-a-SiOx) layer, an amorphous silicon carbide (i-a-SiCx) layer, an indium-gallium-zinc oxide (IGZO) layer, a titanium oxide (TiOx) layer and a molybdenum oxide (MoOx)

layer. In this instance, an amorphous silicon (a-Si) layer, an amorphous silicon oxide (i-a-SiOx) layer and an amorphous silicon carbide (i-a-SiCx) layer applied to the front electric field region 20 or the emitter region 30 may be doped with a first or second conductivity-type dopant. Further, an indium-gallium-zinc oxide (IGZO) layer, a titanium oxide (TiOx) layer and a molybdenum oxide (MoOx) layer applied to the front electric field region 20 or the emitter region 30 include no III-group element or V-group element (for example, boron or phosphorus) used as the first and second conductivity-type dopant, in addition to the materials included in the oxide layers. The indium-gallium-zinc oxide (IGZO) layer, the titanium oxide (TiOx) layer and the molybdenum oxide (MoOx) layer autonomously and selectively collect electrons or holes and may thus serve as an n-type or p-type region. In more detail, the indium-gallium-zinc oxide (IGZO) layer may be of an n-type, the titanium oxide (TiOx) layer may be of an n-type, and the molybdenum oxide (MoOx) layer may be of a p-type.

The amorphous silicon (a-Si) layer, the amorphous silicon oxide (i-a-SiOx) layer and the amorphous silicon carbide (i-a-SiCx) layer have a crystalline structure differing from that of the semiconductor substrate 110, but include a semiconductor material (for example, silicon) forming the semiconductor substrate 110 and may thus have characteristics similar to those of the semiconductor substrate 110. Thereby, a characteristic difference, occurring if a material differing from the semiconductor material of the semiconductor substrate 110 is included, may be minimized. Thereamong, the amorphous silicon oxide (i-a-SiOx) layer and the amorphous silicon carbide (i-a-SiCx) layer have a high energy bandgap and may thus execute sufficient energy band bending and selectively pass carriers. Further, the indium-gallium-zinc oxide (IGZO) layer, the titanium oxide (TiOx) layer and the molybdenum oxide (MoOx) layer have a broad energy bandgap and a low light absorption rate and may thus minimize optical loss.

For example, the front electric field region 20 may include at least one of the indium gallium zinc oxide (IGZO) layer, the titanium oxide (TiOx) layer and the molybdenum oxide (MoOx) layer having a low light absorption rate. Thereby, absorption of light by the front electric field region 20 located on the front surface of the semiconductor substrate 110 may be minimized. In this embodiment, the front electric field region 20 is formed on the first unevenness 112 including the first uneven parts 112a and the second uneven parts 112b, and the indium-gallium-zinc oxide (IGZO) layer, the titanium oxide (TiOx) layer and the molybdenum oxide (MoOx) layer may have excellent characteristics regardless of presence of surface defects on the semiconductor substrate 110. On the other hand, if the front electric field region 20 includes the amorphous silicon (a-Si) layer, the amorphous silicon oxide (i-a-SiOx) layer or the amorphous silicon carbide (i-a-SiCx) layer, characteristics of the front electric field region 20 may be lowered in the state in which formation conditions are not excellent due to presence of surface defects on the semiconductor substrate 110.

Further, the emitter region 30 may include at least one of the amorphous silicon (a-Si) layer, the amorphous silicon oxide (i-a-SiOx) layer and the amorphous silicon carbide (i-a-SiCx) layer. The emitter region 30, which forms a p-n junction with the semiconductor substrate 110 (or a p-n junction with the semiconductor substrate 110 having the second passivation film 54 interposed therebetween) and thus directly relates to photoelectric conversion, includes a semiconductor substance (i.e., silicon) forming the semiconductor substrate 110 so as to have similar characteristics to those of the semiconductor substrate and to more effectively move carriers.

In this embodiment, the thickness of the emitter region 30 may be greater than the front electric field region 20. That is, since the emitter region 30 directly relating to photoelectric conversion is located on the rear surface of the semiconductor substrate 10 and does not disturb light absorption into the front surface of the semiconductor substrate 10, the emitter region 30 may have a relatively great thickness. Further, since the front electric field region 20 does not directly relate to photoelectric conversion and is located on the front surface of the semiconductor substrate 10 so as to relate to light absorption into the front surface of the semiconductor substrate 10, the front electric field region 20 may have a relatively small thickness. Further, if the emitter region 30 is of the p-type, the emitter region 30 may be doped with boron (B), and, since boron (B) having a small atomic size may be easily diffused, the emitter region 30 having a sufficient thickness prevents a large amount of boron (B) from doping the semiconductor substrate 10. If a large amount of a dopant included in the emitter region 30 dopes the semiconductor substrate 10, the solar cell 100 may be deteriorated. However, the disclosure is not limited thereto and, even if the emitter region 30 is of the n-type, the thickness of the emitter region 30 may be greater than the front electric field region 20.

For example, a ratio of the thickness of the front electric field region 20 to the thickness of the emitter region 30 may be 1:1.5 to 1:5.5. If such a ratio is less than 1:1.5, the emitter region 30 does not have a sufficient thickness and thus photoelectric conversion by the emitter region 30 may not be effective. If such a ratio exceeds 1:5.5, the thickness of the front electric field region 20 is excessively small and thus the front electric field region 20 may be difficult to perform its own role, or if the thickness of the emitter region 30 is excessively large, a manufacturing time and a carrier movement distance may be increased and thus carrier collection efficiency may be lowered.

Further, the thickness of the second passivation film 54 may be equal to or greater than the thickness of the first passivation film 52. For example, the thickness of the second passivation film 54 may be greater than the thickness of the first passivation film 52. This may prevent the dopant of the emitter region 30 from undesirably doping the semiconductor substrate 110, considering that the thickness of the emitter region 30 is greater than the thickness of the front electric field region 20. Particularly, if the emitter region 30 is the p-type, doping of the semiconductor substrate 110 with a large amount of boron (B) included in the emitter region 30 may be prevented. For example, a ratio of the thickness of the first passivation film 52 to the thickness of the second passivation film 54 may be 1:1 to 1:2.5. Such a ratio may be determined in consideration of passivation characteristics of the semiconductor substrate 110 and characteristics of the dopant of the emitter region 30, but the disclosure is not limited thereto.

Further, a ratio of the thickness of the emitter region 30 to the thickness of the second passivation film 54 may be greater than a ratio of the thickness of the front electric field region 20 to the thickness of the first passivation film 52. The reason for this is that the thickness of the emitter region 30 is much greater than the thickness of the front electric field region 20. For example, the ratio of the thickness of the first passivation film 52 to the thickness of the front electric field region 20 may be 1:1 to 1:2, and the ratio of the second passivation film 54 to the emitter region 30 may be 1:2 to 1:5. If the ratio of the thickness of the first passivation film 52 to the thickness of the front electric field region 20 is less than 1:1 or the ratio of the second passivation film 54 to the emitter region 30 is less than 1:2, the front electric field region 20 or the emitter region 30 may be difficult to sufficiently perform its own role. If the ratio of the thickness of the first passivation film 52 to the thickness of the front electric field region 20 exceeds 1:2 or the ratio of the second passivation film 54 to the emitter region 30 exceeds 1:5, the thickness of the first or second passivation film 52 or 54 is not sufficient and thus passivation characteristics may be lowered, or the thickness of the front electric field region 20 or the emitter region 30 is relatively increased and thus carrier movement efficiency may be lowered. However, the disclosure is not limited thereto.

Otherwise, for example, the thickness of the front electric field region 20 may be 1 nm to 10 nm (for example, 3 nm to 5.7 nm), and the thickness of the emitter region 30 may be 3 nm to 15 nm (for example, 8 nm to 17.6 nm). Further, the thickness of the first passivation film 52 may be 1 nm to 5 nm, and the thickness of the second passivation film 54 may be 1 nm to 7 nm. These ranges are restricted such that the front electric field region 20, the emitter region 30, and the first and second passivation films 52 and 54 may exhibit the above-described effects. However, the disclosure is not limited thereto.

The first electrodes 42 conductively connected to the front electric field region 20 are located on (for example, contact) the front electric field region 20, and the second electrodes 44 conductively connected to the emitter region 30 located on (for example, contact) the emitter region 30.

The first electrodes 42 may include a first transparent electrode layer 421 and a first metal electrode layer 422 sequentially stacked on the front electric field region 20.

In this instance, the first transparent electrode layer 421 is formed on (for example, contact) the entire surface of the front electric field region 20. Formation of the first transparent electrode layer 421 on the entire surface of the front electric field region 20 may not only include covering the entirety of the front electric field region 20 with the first transparent electrode layer 421 without a vacant space or a vacant region but also include inevitable non-formation of the first transparent electrode layer 421 in some regions. If the first transparent electrode layer 421 is formed on the entire surface of the front electric field region 20, carriers may easily reach the first metal electrode layer 422 through the first transparent electrode layer 421 and, thus, resistance in the horizontal direction may be reduced. Since crystallinity of the front electric field region 20 formed of an amorphous semiconductor layer is relatively low and thus mobility of carriers may be lowered, the first transparent electrode layer 421 lowers resistance when the carriers moves in the horizontal direction.

The first transparent electrode layer 421 is formed on the entire surface of the front electric field region 20 and may thus be formed of a material which may transmit light (a light-transmitting material). That is, the first transparent electrode layer 421 may be formed of a transparent conductive material so as to pass light and to easily move the carriers. Therefore, even if the first transparent electrode layer 421 is formed on the entire surface of the front electric field region 20, transmission of light may not be blocked.

For example, the first transparent electrode layer 421 may include at least one of indium tin oxide (ITO), aluminum zinc oxide (AZO), boron zinc oxide (BZO), indium tungsten oxide (IWO) and indium cesium oxide (ICO). Further, the first transparent electrode layer 421 may include indium oxide doped with titanium (Ti) and tantalum (Ta), i.e., indium titanium tantalum oxide. However, the disclosure is not limited thereto and the first transparent electrode layer 421 may include various other materials.

In this instance, the first transparent electrode layer 421 of this embodiment may further include hydrogen in addition to the above-described material as a main material. That is, the first transparent electrode layer 421 may include at least one of indium tin oxide including hydrogen (ITO:H), aluminum zinc oxide including hydrogen (AZO:H), boron zinc oxide including hydrogen (BZO:H), indium tungsten oxide including hydrogen (IWO:H) and indium cesium oxide including hydrogen (ICO:H).

The first transparent electrode layer 421 may be formed by deposition and, when hydrogen gas is injected during deposition, hydrogen may be included in the first transparent electrode layer 421. If the first transparent electrode layer 421 includes hydrogen, mobility of electrons or holes may be improved and transmittance may be improved.

For example, in this embodiment, the first transparent electrode layer 421 using ICO:H may have further improved optical characteristics. This will be described in more detail. Table 1 below sets forth the specific resistances, carrier densities and mobilities of ITO, IWO, ICO and ICO:H.

TABLE 1

|  | ITO | IWO | ICO | ICO:H |
|---|---|---|---|---|
| Specific resistance [ohm · cm] | 1.98E−04 | 3.85E−04 | 3.57E−04 | 2.23E−04 |
| Carrier density [/cm$^3$] | 9.00E+20 | 2.50E+20 | 2.50E+20 | 2.00E+20 |
| Mobility [cm$^2$/V · s] | 35 | 65 | 70 | 130~145 |

With reference to Table 1, ITO has slightly low specific resistance but has electrical characteristics, i.e., a high carrier density and very low mobility. It may be seen that IWO and ICO have lower carrier densities and slightly higher mobilities than those of ITO but have higher specific resistances than that of ITO. On the other hand, ICO:H has similar specific resistance to that of ITO and a low carrier density but has much higher mobility than those of ITO, IWO and ICO excluding hydrogen. ICO:H having a low carrier density and high mobility has low specific resistance but may improve transmittance due to lowering of light absorption using free carriers. Therefore, ICO:H may have excellent electrical characteristics due to low specific resistance, and improve transmittance so as to have excellent optical characteristics. Such excellent optical characteristics may exhibit excellent effects in a solar cell, which performs photoelectric conversion using light, rather than in other electrical devices, which do not directly use light (for example, a display device, a semiconductor device, etc.).

In this embodiment, the first metal electrode layer 422 having a pattern may be formed on the first transparent electrode layer 421. For example, the first metal electrode layer 422 may contact the first transparent electrode layer 421 and thus simplify the structure of the first electrodes 42. However, the disclosure is not limited thereto and there are various modifications, such as presence of a separate layer between the first transparent electrode layer 421 and the first metal electrode layer 422, etc.

The first metal electrode layer 422 located on the first transparent electrode layer 421 may be formed of a material having higher electrical conductivity than the first transparent electrode layer 421. Therefore, the first metal electrode layer 422 may further improve characteristics, such as carrier collection efficiency, resistance reduction, etc. For example, the first metal electrode layer 422 may be formed of an opaque metal having excellent electrical conductivity or a metal having lower transparency than the first transparent electrode layer 421.

Since the first metal electrode layer 422 is opaque or has low transparency and may thus disturb incidence of light, the first metal electrode layer 422 may have a designated pattern so as to minimize shading loss. Therefore, light may be incident upon regions in which the first metal electrode layer 422 is not formed. The plan shape of the first metal electrode layer 422 will be described in more detail later with reference to FIG. 2.

The second electrodes 44 may include a second transparent electrode layer 441 and a second metal electrode layer 442 sequentially stacked on the emitter region 30. With the exception that the second electrodes 44 are located on the emitter region 30, the functions, materials, shapes, etc., of the second transparent electrode layer 441 and the second metal electrode layer 442 of the second electrodes 44 are the same as the functions, materials, shapes, etc., of the first transparent electrode layer 421 and the first metal electrode layer 422 of the first electrodes 42 and, thus, the above description of the first transparent electrode layer 421 and the first metal electrode layer 422 of the first electrodes 42 may be equally applied to the second transparent electrode layer 441 and the second metal electrode layer 442 of the second electrodes 44.

In this embodiment, the thickness of the first transparent electrode layer 42 may be greater than the thickness of the second transparent electrode layer 441. That is, the first transparent electrode layer 42 may have a relatively great thickness so as to serve as an anti-reflection film, which may prevent reflection of light, and the second transparent electrode layer 441 which does not critically require the function as an anti-reflection film, may have a relatively small thickness.

For example, a ratio of the thickness of the second transparent electrode layer 441 to the thickness of the first transparent electrode layer 42a may be 1:1.1 to 1:4 (for example, 1:1.2 to 1:2.25). If such a ratio is less than 1:1.1, the second transparent electrode layer 141 may not sufficiently serve as an anti-reflection film. If such a ratio exceeds 1:4, the thickness of the second transparent electrode layer 411 is not sufficient and thus electrical characteristics may be lowered, or the thickness of the first transparent electrode layer 421 is increased and thus manufacturing costs, a manufacturing time, etc., may be increased. If the ratio is 1:1.2 to 1:1.25, effects of the first and second transparent electrode layers 421 and 441 may be sufficient exhibited. However, the disclosure is not limited thereto.

Otherwise, for example, the thickness of the first transparent electrode layer 421 may be 70 nm to 90 nm, and the thickness of the second transparent electrode layer 441 may be 50 nm to 80 nm. These ranges are restricted so that the first and second transparent electrode layers 421 and 441 may sufficiently implement desired characteristics. However, the disclosure is not limited thereto.

In this embodiment, the first and second metal electrode layers 422 and 442 of the first and second electrodes 42 and 44 may be formed of a material which may be fired at a low temperature (for example, at a process temperature of 300° C. or lower. For example, the first and second metal electrode layers 422 and 442 may not include glass frit formed of a designated metal compound (for example, an oxide including oxygen, a carbide including carbon, or a sulfide including sulfur), but may include only a conductive material and a resin (a binder, a hardening agent and additives). The first and second metal electrode layers 422 and 442 do not include glass frit and may thus be easily fired at a low temperature. The conductive material may include silver (Ag), aluminum (Al), copper (Cu), etc., and the resin may include a cellulose-based or phenolic-based binder, an amine-based hardening agent, etc.

As such, in this embodiment, the first and second metal electrode layers 422 and 442 contact the first and second transparent electrode layers 421 and 441 and, thus, fire through holes need not be formed through an insulation film. Therefore, a low-temperature firing paste, from which glass frit is removed, is used. Since the first and second metal electrode layers 422 and 442 do not include glass frit and includes only a conductive material and a resin, the conductive material may be sintered and thus conductive material molecules may contact each other without connection and be aggregated so as to have conductivity.

Alternatively, the first and second metal electrode layers 422 and 442 may be formed by plating.

Now, the plan shapes of the first and second metal electrode layers 422 and 442 of the first and second electrodes 42 and 44 will be described in more detail with reference to FIG. 2.

Figure 2:
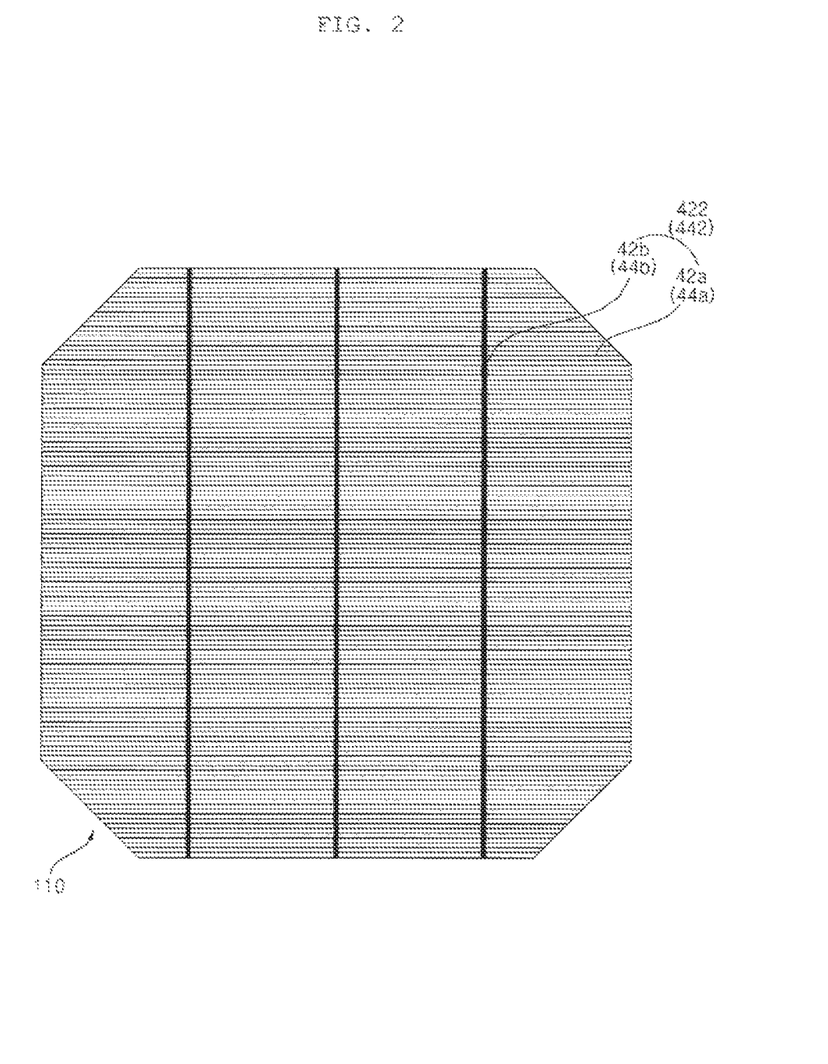
FIG. 2 is a plan view of first and second metal electrode layers of the solar cell shown in FIG. 1.

FIG. 2 is a plan view of the first and second metal electrode layers 422 and 442 of the solar cell 100 shown in FIG. 1. FIG. 2 illustrates only the semiconductor substrate 110 and the first and second metal electrode layers 422 and 442 of the first and second electrodes 42 and 44.

With reference to FIG. 2, the first and second metal electrode layers 422 and 442 may include a plurality of finger electrodes 42a and 44a spaced apart from each other at a designated pitch. Although FIG. 2 illustrates that the finger electrodes 42a and 44a are parallel to each other and are parallel to the edges of the semiconductor substrate 110, the disclosure is not limited thereto. Further, the first and second metal electrode layers 422 and 442 may include bus bar electrodes 42b and 44b formed in a direction intersecting the finger electrodes 42a and 44a so as to connect the forger electrodes 42a and 44a. One bus bar electrode 42b and 44b may be provided or, as shown by example in FIG. 2, a plurality of bus bar electrodes 42b and 44b may be provided at a pitch greater than the pitch of the finger electrodes 42a and 44a. In this instance, the width of the bus bar electrodes 42b and 44b may be greater than the width of the finger electrodes 42a and 44a, but the disclosure is not limited thereto. Therefore, the width of the bus bar electrodes 42b and 44b may be equal to or less than the width of the finger electrodes 42a and 44a.

FIG. 2 exemplarily illustrates the first and second metal electrode layers 422 and 442 as having the same plan shape. However, the disclosure is not limited thereto and the widths, pitches, etc., of the finger electrodes 42a and the bus bar electrodes 42b of the first metal electrode layer 422 may have different values from the widths, pitches, etc., of the finger electrodes 44a and the bus bar electrodes 44b of the second metal electrode layer 442. Further, the first and second metal electrode layers 422 and 442 may have different plan shapes and various other modifications are possible.

In this embodiment, the first and second metal electrode layers 422 and 442, including an opaque metal or a metal having low transparency, of the first and second electrodes 42 and 44 of the solar cell 100 have a designated pattern and, thus, the solar call 100 has a bi-facial light-receiving structure in which light may be incident upon the front and rear surfaces of the semiconductor substrate 110. Thereby, a quantity of light used by the solar cell 100 is increased, thus contributing to improvement in efficiency of the solar cell 100. However, the disclosure is not limited thereto and the second metal electrode layer 442 of the second electrodes 44 may be formed on the entire rear surface of the semiconductor substrate 110. This will be described in detail later with reference to FIGS. 5 and 6.

In accordance with this embodiment, the front electric field region 20 is located on the front surface of the semiconductor substrate 110 with the first passivation layer 52 interposed therebetween, and the emitter region 30 is located on the rear surface of the semiconductor substrate 110 with the second passivation layer 54 interposed therebetween. Thereby, the front electric field region 20 has a relatively small thickness and thus optical loss may be minimized, and the emitter region 30 has a relatively large thickness and thus photoelectric conversion may be effectively executed and passivation characteristics may be improved. Further, the semiconductor substrate 110 does not include a doped region but includes only the base region 10, thus having excellent passivation characteristics. Moreover, by restricting thickness relationships and thickness ratios between the first passivation film 52 and the first transparent electrode layer 421 located on the front surface of the semiconductor substrate 110 and the second passivation film 54 and the second transparent electrode layer 441 located on the rear surface of the semiconductor substrate 110, and the materials of the front electric field region 20, the emitter region 30, the first and second passivation films 52 and 54 and the first and second transparent electrode layers 421 and 441, passivation characteristics may be maximized and a current density may be maximized. Thereby, efficiency of the solar cell 100 may be maximized.

The above-described solar cell 100 may be formed through various processes. A method of manufacturing a solar cell 100 in accordance with one embodiment of the present invention will be described in detail with reference to FIGS. 3A to 3E. FIGS. 3A to 3E are cross-sectional views illustrating a method of manufacturing the solar cell 100 in accordance with this embodiment.

Figure 3A:
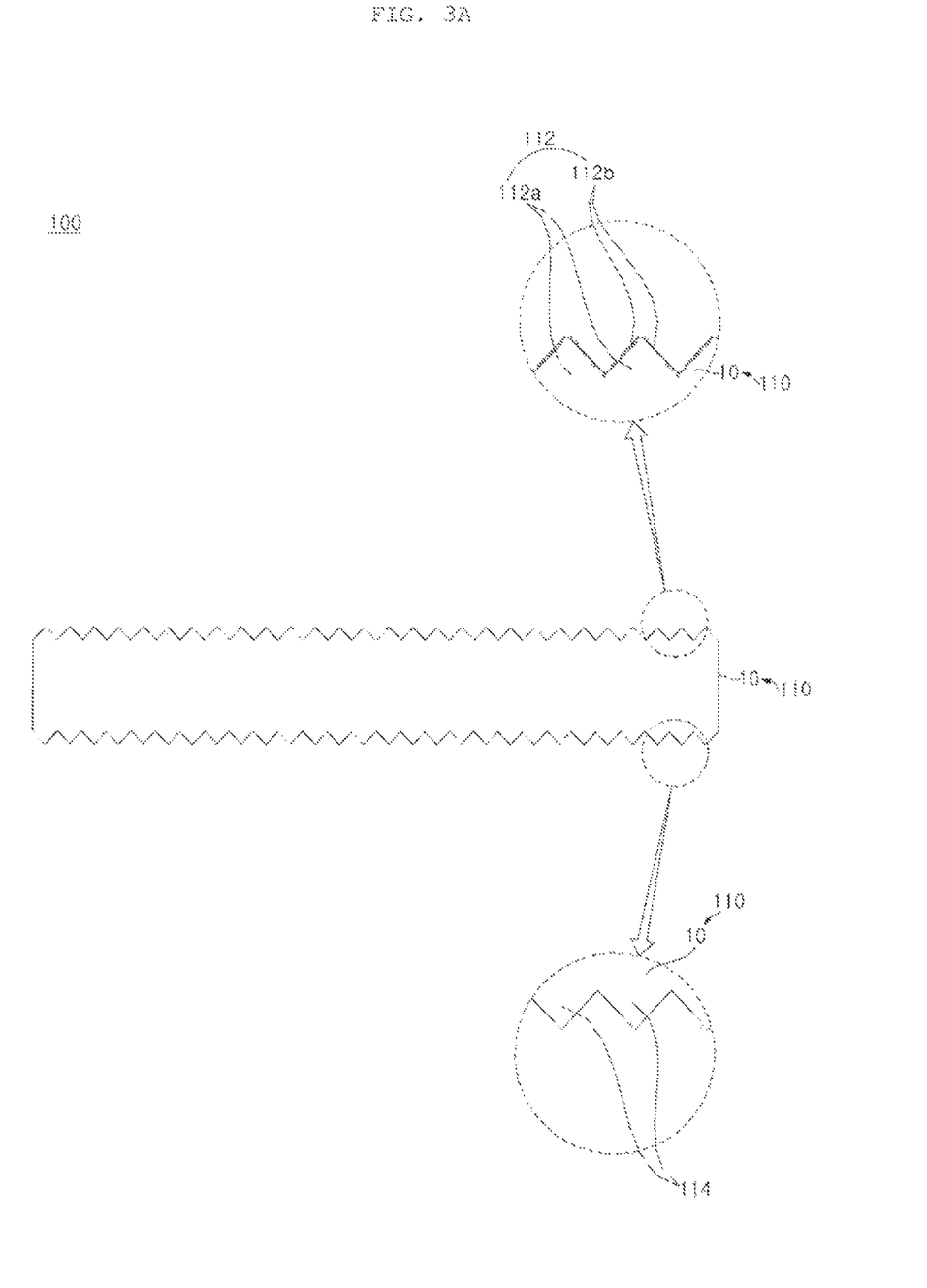
FIGS. 3A to 3E are cross-sectional views illustrating a method of manufacturing a solar cell in accordance with one embodiment of the present invention.

First, as shown by example in FIG. 3A, first and second unevennesses 112 and 114 are formed on the semiconductor substrate 110. In more detail, and as described above, first uneven parts 112a and 114a of the first and second unevennesses 112 and 114 are formed by wet etching, and then, second uneven parts 112b of the first unevenness 112 may be formed by reactive ion etching (RIE). However, the disclosure is not limited thereto and the first and second unevennesses 112 and 114 may be formed through various methods.

Figure 3B:
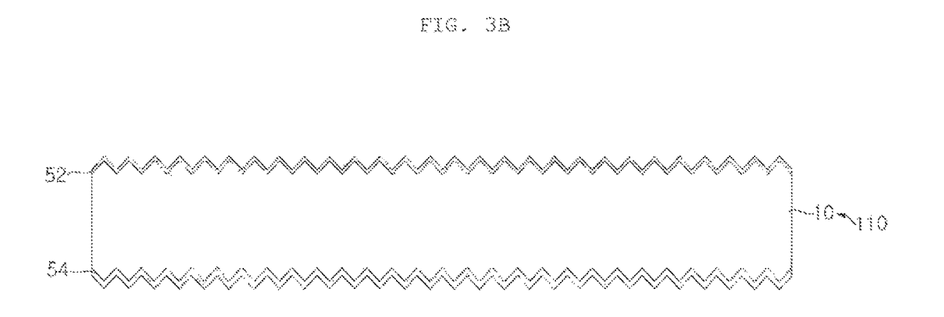

Thereafter, as shown by example in FIG. 3B, first and second passivation films 52 and 54 may be formed on the semiconductor substrate 110. The first and second passivation films 52 and 54 may be formed by, for example, thermal growth, deposition (for example, plasma-enhanced chemical vapor deposition (PECVD) or atomic layer deposition (ALD)), etc. However, the disclosure is not limited thereto and the first and second passivation films 52 and 54 may be formed through various methods. The first and second passivation films 52 and 54 may be simultaneously formed or sequentially formed.

Figure 3C:
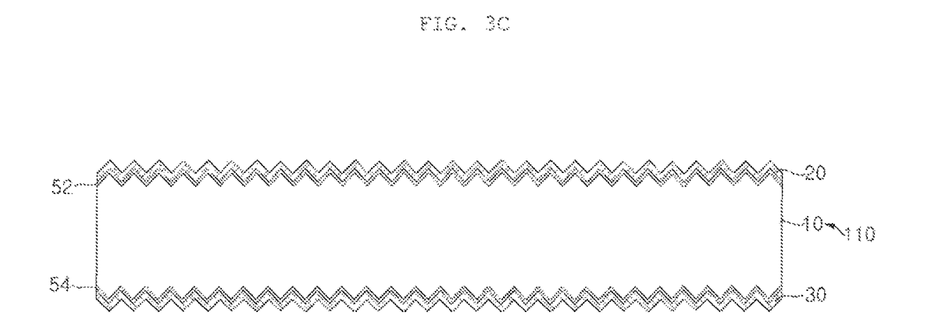

Thereafter, as shown by example in FIG. 3C, a front electric field region 20 and an emitter region 30 are formed on the first and second passivation films 52 and 54. In more detail, the front electric field region 20 is formed on the first passivation film 52 and the emitter region 30 is formed on the second passivation film 54.

The front electric field region 20 and the emitter region 30 may be formed by, for example, deposition (for example, plasma-enhanced chemical vapor deposition (PECVD) or low-pressure chemical vapor deposition (LPCVD)). Semiconductor layers for forming the front electric field region 20 and the emitter region 30 may include first and second dopants during a process of growing the semiconductor layers or, after formation of the semiconductor layers, the semiconductor layers may be doped with the first and second dopants by ion implantation, thermal diffusion, laser doping, etc. However, the disclosure is not limited thereto and the front electric field region 20 and the emitter region 30 may be formed through various methods. The front electric field region 20 and the emitter region 30 may be simultaneously formed and then doped with the first and second dopants, or at least one of sequentially deposited and doped with the first and second dopants.

For example, the front electric field region 20 and the emitter region 30 may be formed by injecting a gas mixture, formed by mixing gas including a dopant material, hydrogen ($H_2$) gas and carrier gas (for example, argon (Ar) gas or nitrogen ($N_2$) gas), together with raw main materials (for example, silane ($SiH_4$) gas) forming front electric field region 20 and the emitter region 30.

In this instance, if the front electric field region 20 includes an n-type semiconductor layer, gas including a dopant material may employ phosphine ($PH_3$) gas and, if the emitter region 30 includes a p-type semiconductor layer, gas including a dopant material may include diborane ($B_2H_6$) gas. As a ratio of gas including a dopant material to silane gas increases, the semiconductor layer having a higher doping concentration may be formed.

For example, in the front electric field region 20, a ratio of gas including a dopant material to silane gas may exceed 0% and be 0.5% or less and, in this instance, a ratio of silane gas to hydrogen gas may be 1 to 20%. Further, in the front electric field region 20, a ratio of gas including the dopant material to silane gas may exceed 0.5% and be 1.0% or less and, in this instance, a ratio of hydrogen gas to silane gas is 20 to 70%.

At the above ratio which exceeds 0.5% and is less than 1.0%, a ratio of hydrogen gas to silane gas 20 to 70% and, as the dopant gas increases, the amount of hydrogen gas may increase. In this instance, the doped semiconductor layer may have a higher hydrogen concentration than an intrinsic semiconductor layer.

Within the above-described ranges, the front electric field region 20 may have a sufficient doping concentration and maintain stability due to hydrogen gas and a suitable deposition speed. Further, in the emitter region 30, a ratio of gas including a dopant material to silane gas may exceed 0 and be 0.3% or less and, in this instance, a ratio of silane gas to hydrogen gas may be 1 to 120%. Further, in the emitter region 30, a ratio of gas including the dopant material to silane gas may exceed 0.3% and be 1.0% or less and, in this instance, a ratio of silane gas to hydrogen gas may be 20 to 200%. Within the above-described ranges, the emitter region 30 may have a sufficient doping concentration and maintain stability due to hydrogen gas and a suitable deposition speed. However, the disclosure is not limited to the above numerical ranges. In formation of the front electric field region 20 and the emitter region 30, ranges of ratios of dopant gases to silane gas are different, as described above. That is, the range of the ratio of dopant gas to silane gas used to form the front electric field region 20 may be broader than the range of the ratio of dopant gas to silane gas used to form the emitter region 30.

Further, in formation of the front electric field region 20 and the emitter region 30, a deposition temperature may be 100 to 250° C. and, in this instance, a ratio of hydrogen gas to silane gas may be 2 to 30%. Further, within a narrower range, in formation of the front electric field region 20 and the emitter region 30, a deposition temperature may be 140 to 200° C. and, in this instance, a ratio of hydrogen gas to silane gas may be 5 to 20%. That is, in this embodiment, the deposition temperature and the ratio of hydrogen gas to silane gas may be in direct proportion to each other and, thus, as the deposition temperature increases, the ratio of hydrogen gas to silane gas may increase. Within such a range, stability due to hydrogen gas may be improved and a suitable deposition speed may be maintained.

Further, in this embodiment, the energy bandgap of the front electric field region 20 may be greater than the energy bandgap of the semiconductor substrate 110. Similarly, the energy bandgap of the emitter region 30 may be greater than the energy bandgap of the semiconductor substrate 110. Thereby, the front electric field region 20 and the emitter region 30 may selectively collect carriers (electrons and holes). In this instance, the bandgaps of the front electric field region 20 and the emitter region 30 may depend on the ratios of hydrogen gas to silane gas.

In formation of the front electric field region 20 and the emitter region 30, if silane gas is provided but gas including dopants is not provided (i.e., in the instance of intrinsic semiconductor layers), the bandgap of the front electric field region 20 may be greater than the bandgap of the emitter region 30. That is, by controlling ratios of hydrogen gas to silane gas, the bandgap of the intrinsic semiconductor layer of the front electric field region 20 may be greater than the bandgap of the intrinsic semiconductor layer of the emitter region 30. In this instance, a ratio of the bandgap of the emitter region 30 to the bandgap of the front electric field region 20 may be 1 to 1.15.

If the front electric field region 20 and the emitter region 30 respectively have bandgaps of 1.7 to 1.8, the ratio of gas including the dopant to silane gas for forming the front electric field region 20 may be higher than the ratio of gas including the dopant to silane gas for forming the emitter region 30. That is, the ratio of gas including the dopant to silane gas for forming the front electric field region 20 may be 3 to 10 times the ratio of gas including the dopant to silane gas for forming the emitter region 30.

If the front electric field region 20 and the emitter region 30 respectively have bandgaps of 1.1 to 1.7, the ratio of gas including the dopant to silane gas for forming the front electric field region 20 may be higher than the ratio of gas including the dopant to silane gas for forming the emitter region 30. That is, the ratio of gas including the dopant to silane gas for forming the front electric field region 20 may be 1 to 8 times the ratio of gas including the dopant to silane gas for forming the emitter region 30.

In this embodiment, the energy bandgaps of the front electric field region 20 and the emitter region 30 may be effectively controlled by adjusting the ratios of dopant gases to silane gas. Further, although this embodiment describes the front electric field region 20 of an n-type and the emitter region 30 of a p-type, such a description is only by example and the disclosure is not limited thereto. Therefore, on the contrary to the above description, the front electric field region 20 of a p-type and the emitter region 30 of an n-type may be formed. Moreover, although this embodiment describes the front electric field region 20 as being disposed on the front surface of the solar cell 100 and the emitter region 30 as being disposed on the rear surface of the solar cell 100, such a description is only by example and the positions of the front electric field region 20 and the emitter region 30 may be reversed. In this instance, the front electric field region 20 may be referred to as a rear electric field region 20.

Figure 3D:
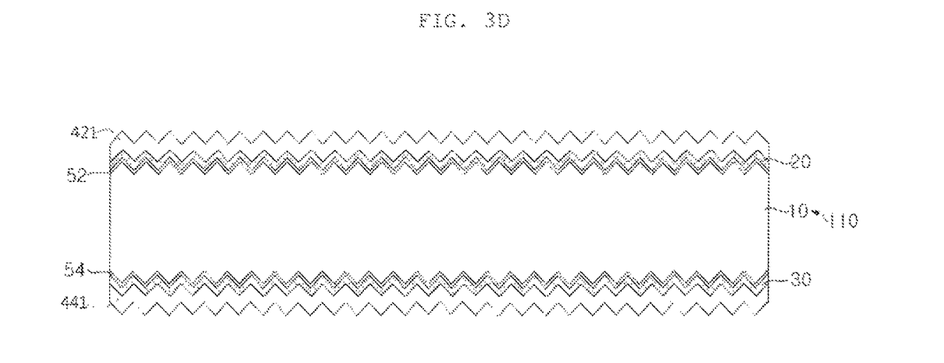

Thereafter, as shown by example in FIG. 3D, first and second transparent electrode layers 421 and 441 are formed on the front electric field region 20 and the emitter region 30. In more detail, the first transparent electrode layer 421 may be formed on the front electric field region 20, and the second transparent electrode layer 442 may be formed on the emitter region 30.

The first and second transparent electrode layers 421 and 441 may be formed by, for example, deposition (for example, plasma-enhanced chemical vapor deposition (PECVD), coating, etc). However, the disclosure is not limited thereto and the first and second transparent electrode layers 421 and 441 may be formed through various methods.

For example, the first and second transparent electrode layers 421 and 441 may be formed by injecting a gas mixture, formed by mixing hydrogen ($H_2$) gas and carrier gas (for example, argon (Ar) gas or nitrogen ($N_2$) gas), together with raw main materials forming the first and second transparent electrode layers 421 and 441. Thereby, the first and second transparent electrode layers 421 and 441 include hydrogen and thus effects of hydrogen may be implemented. For example, a ratio of hydrogen gas to carrier gas (for example, a ratio of $H_2/N_2$ or a ratio of $H_2/Ar$) may be 0.5 to 5% (for example, % by volume). If such a ratio is less than 0.5%, effects of hydrogen may not be sufficient. However, the disclosure is not limited to such a numerical ratio. If the ratio exceeds 5%, stability due to hydrogen gas may be lowered and a deposition speed may be decreased. In more detail, the ratio of hydrogen gas to carrier gas (i.e., a ratio of $H_2/N_2$) may be 0.5 to 2%. The reason for this is that, within such a rage, stability may be further improved and a deposition speed may be increased. However, the disclosure is not limited to such a numerical range.

In this embodiment, oxygen gas may be further injected together with hydrogen gas and nitrogen gas. Oxygen is included as raw main materials, but oxygen in the first and second transparent electrode layers 421 and 441 may be maintained at a proper ratio by additionally injecting oxygen. For example, a ratio of oxygen gas to carrier gas (for example, a ratio of $O_2/N_2$ or a ratio of $O_2/Ar$) may be 15 to 40% (for example, % by volume). If such a ratio is less than 15%, effects of oxygen gas may not be sufficient and, if the ratio exceeds 40%, electrical characteristics of the first and second transparent electrode layers 421 and 441 may be deteriorated. However, the disclosure is not limited to such a numerical range.

Figure 3E:
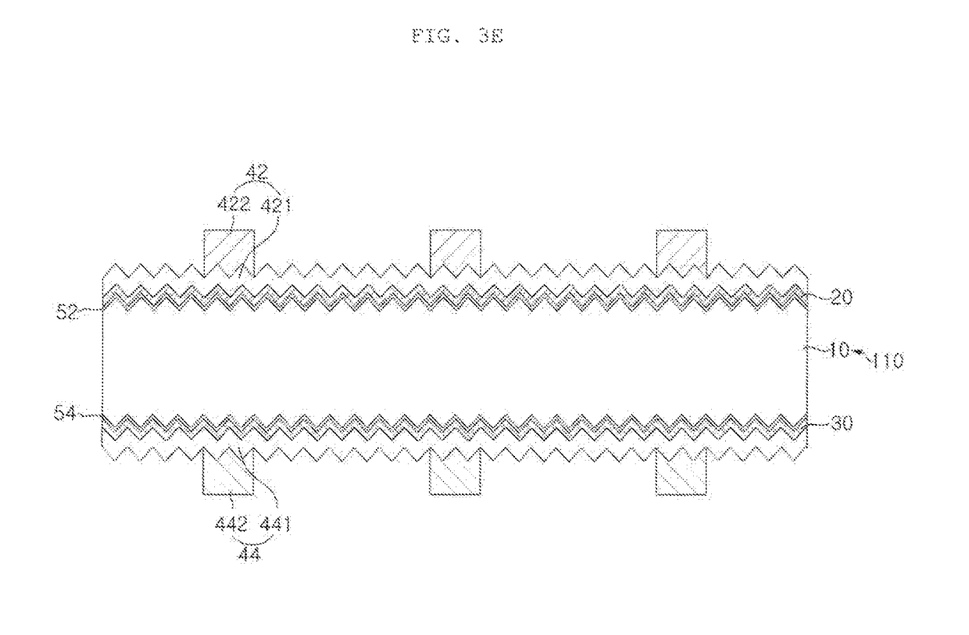

Thereafter, as shown by example in FIG. 3E, first and second metal electrode layers 422 and 442 are formed on the first and second transparent electrode layers 421 and 441.

For example, one of the first and second metal electrode layers 422 and 442 may be formed by forming a first low-temperature paste layer on one of the front electric field region 20 and the emitter region 30 (in more detail, on one of the first and second transparent electrode layers 421 and 441) and then drying the first low-temperature paste layer, and the other of the first and second metal electrode layers 422 and 442 may be formed by forming a second low-temperature paste layer on the other of the front electric field region 20 and the emitter region 30 and then drying the second low-temperature paste layer. It may be difficult to form both the first and second low-temperature paste layers having fluidity on both surfaces of the semiconductor substrate 110 so as to have a desired pattern. In consideration of such a difficulty, after one of the first and second metal electrode layers 422 and 442 is formed by forming the first low-temperature paste layer having fluidity on one surface of the semiconductor substrate 110 and then drying the first low-temperature paste layer, the second low-temperature paste layer having fluidity is formed on the other surface of the semiconductor substrate 110. Thereby, problems, such as flowing-down of the first low-temperature paste layer during formation of the second low-temperature paste layer, may be prevented. However, the disclosure is not limited thereto, and the first and second low-temperature paste layers may be simultaneously formed on both surfaces of the semiconductor substrate 110 and then simultaneously dried.

The first or second low-temperature paste layer may include a conductive material, a resin (a binder, a hardening agent, additives, etc.) and a solvent. Compositions of the conductive material and the resin have been described above and a detailed description thereof will thus be omitted. Various materials may be used as the solvent and, for example, an ether-based solvent may be used. In this instance, the first and second low-temperature past layers may include 85 to 90 parts by weight of a conductive material, 1 to 15 parts by weight of a resin, and 5 to 10 parts by weight of a solvent with respect to 100 parts by weight. However, the disclosure is not limited thereto.

The first or second low-temperature paste layer may be formed through various methods, for example, by printing so as to have a desired pattern. Thereby, the first or second low-temperature paste layer having a designated pattern may be formed through a simple process.

The first or second low-temperature paste layer may be dried at a temperature of 300° C. or lower. Such a temperature is restricted so as to prevent deterioration of the first and second passivation films 52 and 54, the front electric field region 20 and the emitter region 30. However, the disclosure is not limited thereto.

The solvent of the first or second low-temperature paste layer is removed by such a drying operation and, thus, the first or second metal electrode layer 422 or 442 may include the conductive material and the resin without a metal compound including oxygen, carbon, sulfur, etc.

However, the disclosure is not limited thereto and at least one of the first and second metal electrode layers 422 and 442 may be formed by plating. For example, the first or second metal electrode layer 422 or 442 may be an electroplating layer including copper, formed by electroplating using copper.

Solar cells in accordance with other embodiments of the present invention will be described in detail with reference to the accompanying drawings. The above description may be applied to parts which are substantially the same as or similar to the description and a detailed description of these parts will thus be omitted. Further, combinations of the above-described embodiment or modified embodiments thereof, and embodiments which will be described later or and modified embodiments thereof will be within the scope of the invention.

Figure 4:
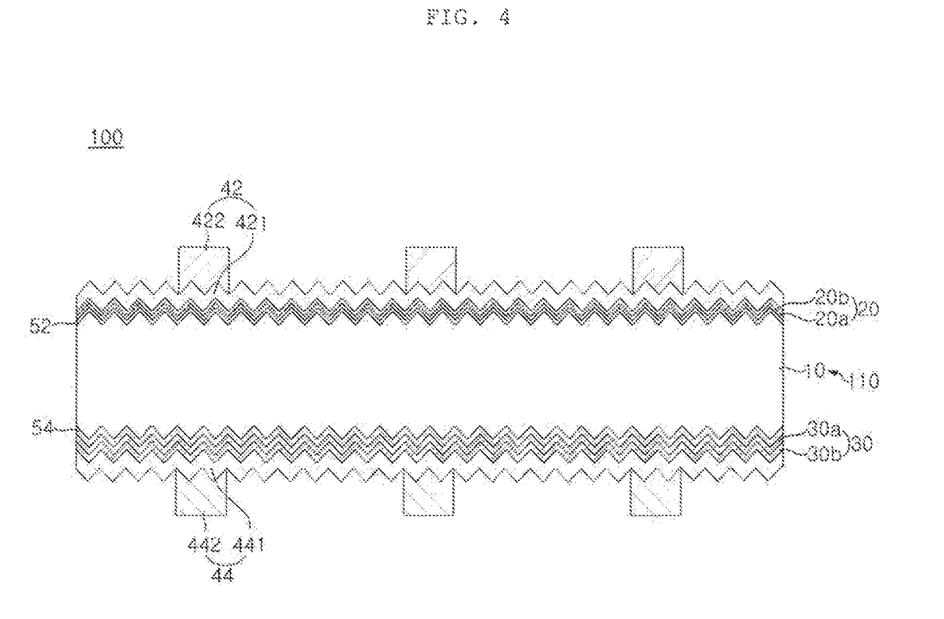
FIG. 4 is a cross-sectional view illustrating a solar cell in accordance with a further embodiment of the present invention.

FIG. 4 is a cross-sectional view illustrating a solar cell in accordance with a further embodiment of the present invention.

With reference to FIG. 4, in a solar cell 100 in accordance with this embodiment, a front electric field region 20 includes a first electric field part (a low concentration part) 20a formed adjacent to a semiconductor substrate 110 or a first passivation film 52, and a second electric field part (a high concentration part) 20b including a first conductivity-type dopant at a higher doping concentration than the first electric field part 20a and thus having lower resistance than the first electric field part 20a. Further, an emitter region 30 includes a first emitter part (a low concentration part) 30a formed adjacent to the semiconductor substrate 110 or a second passivation film 54, and a second emitter part (a high concentration part) 30b includes a second conductivity-type dopant at a higher doping concentration than the first emitter part 30a and thus having lower resistance than the first emitter part 30a.

The first electric field part 20a or the first emitter part 30a may form a designated electric field on the semiconductor substrate 110 and thus serve to passivate the semiconductor substrate 110. Further, the second electric field part 20b or the second emitter part 30b may serve to improve contact characteristics of first or second transparent electrode layer 421 or 441 and to minimize non-coincidence in a work function with the first or second transparent electrode layer 421 or 441.

In this instance, a ratio of the thickness of the second electric field part 20b to the thickness of the front electric field region 20 may be 35 to 55%, and a ratio of the thickness of the second emitter part 30b to the thickness of the emitter region 30 may be 30 to 50%. For example, the thickness of the first electric field part 20a may be 1 nm to 4 nm, and the thickness of the second electric field part 20b may be 1 nm to 5 nm (for example, 2 nm to 5 nm. Further, the thickness of the first emitter part 30a may be 5 nm to 10 nm, and the thickness of the second emitter part 30b may be 3 nm to 8 nm. Within these ranges, the first electric field part 20a, the second electric field part 20b, the first emitter part 30a and the second emitter part 30b may sufficiently executes the above-described functions.

In this instance, for example, the thickness of the first electric field part 20a may be greater than the thickness of the second electric field part 20b. Similarly, the thickness of the first emitter part 30a may be greater than the thickness of the second emitter part 30b. If the first electric field part 20a or the first emitter part 30a serving to passivate the semiconductor substrate 110 has a small thickness, passivation effects may be relatively lowered. On the other hand, even if the second electric field part 20b or the second emitter part 20a has a relatively small thickness, the second electric field part 20b or the second emitter part 20a may sufficiently execute the functions thereof. Therefore, by causing the thickness of the first electric field part 20a to be greater than the thickness of the second electric field part 20b and causing the thickness of the first emitting part 30a to be greater than the thickness of the second emitting part 30b, both passivation effects and contact characteristics with first or second transparent electrode layer 421 or 441 may be improved. However, the disclosure is not limited thereto. Therefore, the thickness of the first electric field part 20a may be smaller than the thickness of the second electric field part 20b, and various other modifications are possible.

Further, a ratio of the doping concentration of the second emitter part 30a to the doping concentration of the first emitter part 30b may be equal to or greater than a ratio of the doping concentration of the second electric field part 20a to the doping concentration of the first electric field part 20b. Otherwise, the doping concentration of the first emitter part 20a with the second conductivity-type dopant may be equal to smaller than the doping concentration of the first electric field part 20a with the first conductivity-type dopant. For example, the ratio of the doping concentration of the first emitter part 30a to the doping concentration of the second emitter part 30b may be greater than the ratio of the doping concentration of the first electric field part 20a to the doping concentration of the second electric field part 20b, or the doping concentration of the first emitter part 20a with the second conductivity-type dopant may be smaller than the doping concentration of the first electric field part 20a with the first conductivity-type dopant.

If the first emitter part 30a is the p-type, boron may be used as the second conductivity-type dopant. In this instance, boron may diffuse to the interface between the semiconductor substrate 110 and the second passivation film 54 and thus interfacial characteristics may be deteriorated. Further, as the amount of boron increases, hydrogen in the semiconductor substrate 110 or the second passivation film 54 is diffused to the outside at a higher out-diffusing rate and thus passivation characteristics may be deteriorated. In consideration of such a fact, the doping concentration of the first emitter part 30a with the second conductivity-type dopant may be smaller than the doping concentration of the first electric field part 20a with the first conductivity-type dopant and thereby the above-described relationships may be satisfied.

For example, the ratio of the doping concentration of the second electric field part 20a to the doping concentration of the first electric field part 20b may exceed 1 and be 1.3 or less, and the ratio of the doping concentration of the second emitter part 30a to the doping concentration of the first emitter part 30b may exceed 1 and be 1.5 or less. For example, the ratio of the doping concentration of the first electric field part 20a to the doping concentration of the second electric field part 20b may be 1.05 to 1.3, and the ratio of the doping concentration of the first emitter part 30a to the doping concentration of the second emitter part 30b may be 1.05 to 1.5. These ranges are restricted so as to maximize effects of the first and second electric field parts 20a and 20b and the first and second emitter parts 30a and 30b, but the disclosure is not limited thereto.

Figure 5:
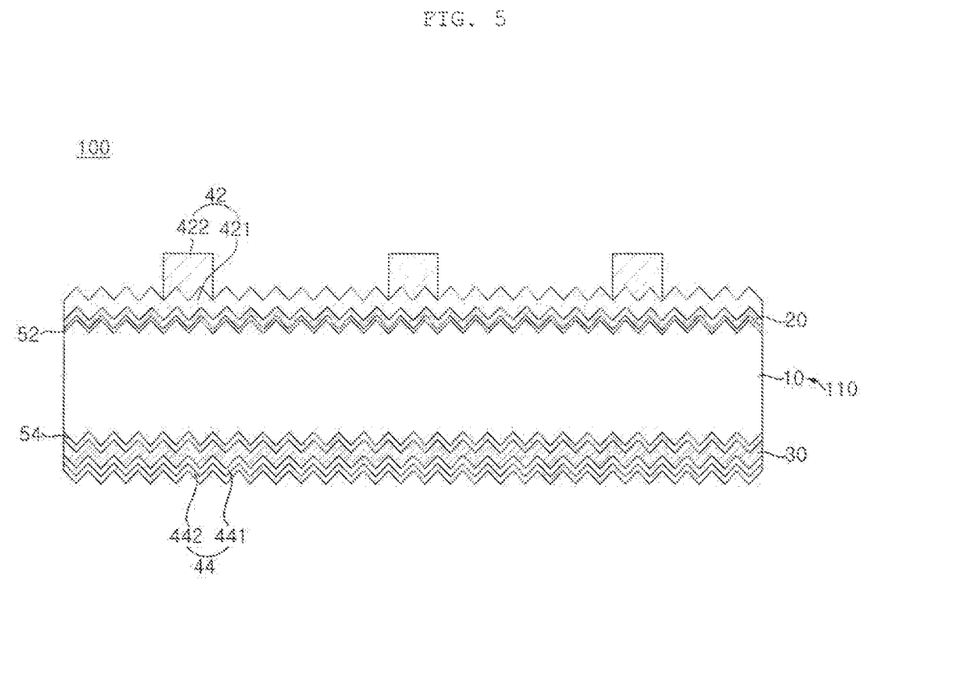
FIG. 5 is a cross-sectional view illustrating a solar cell in accordance with another embodiment of the present invention.

FIG. 5 is a cross-sectional view illustrating a solar cell in accordance with another embodiment of the present invention.

With reference to FIG. 5, in a solar cell 100 in accordance with this embodiment, a second metal electrode layer 442 does not have a pattern and may be formed on the entire surface of a second transparent electrode layer 441 on the rear surface of a semiconductor substrate 110. Thereby, the second metal electrode layer 442 may serve as a reflective film on the rear surface of the semiconductor substrate 110 and thus reflect light reaching the second metal electrode layer 442 via an emitter region 30 so as to reuse light. Therefore, a quantity of light may be increased and photoelectric conversion effects may be improved.

In this instance, since the second metal electrode layer 442 is formed on the entire rear surface of the semiconductor substrate 110 and thus has a sufficient resistance, the second metal electrode layer 442 may have a smaller thickness than a first metal electrode layer 421 formed in a pattern.

Figure 6:
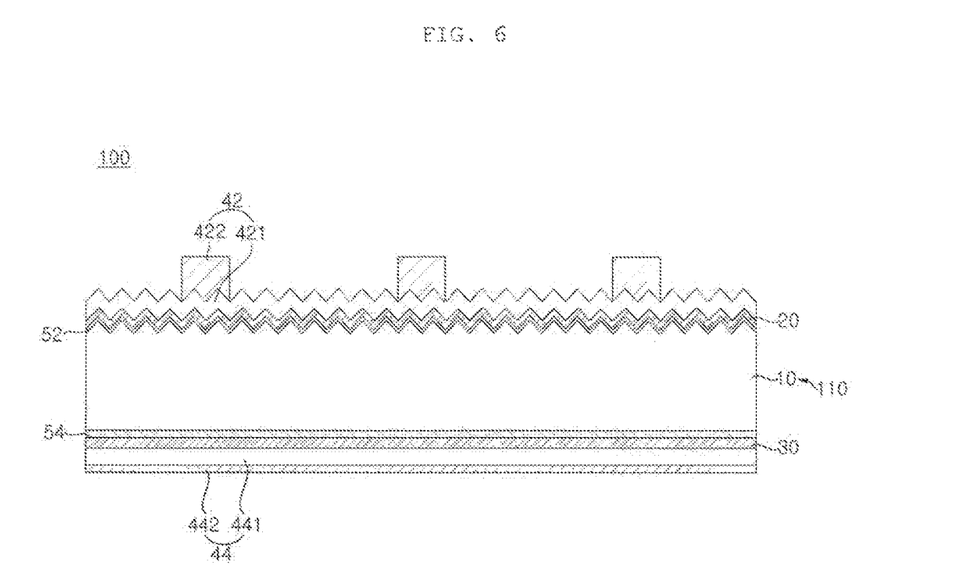
FIG. 6 is a cross-sectional view illustrating a solar cell in accordance with yet another embodiment of the present invention.

FIG. 6 is a cross-sectional view illustrating a solar cell in accordance with yet another embodiment of the present invention.

With reference to FIG. 6, in a solar cell 100 in accordance with this embodiment, a second unevenness (114 in FIG. 1) is not provided on the rear surface of a semiconductor substrate 110 and, thus, the rear surface of the semiconductor substrate 110 may have lower surface roughness than the front surface of the semiconductor substrate 110. For example, the rear surface of the semiconductor substrate 110 is mirror surface-polished and may thus have surface roughness of 100 nm or less. Further, a second metal electrode layer 442, which does not have a pattern, may be formed on the entire surface of a second transparent electrode layer 441 on the rear surface of the semiconductor substrate 110. Thereby, reflection effects of the second metal electrode layer 442 on the rear surface of the semiconductor substrate 110 may be further improved.

As apparent from the above description, in a solar cell and a method of manufacturing the same in accordance with one embodiment of the present invention, the thickness of a front electric field region may be relatively decreased so as to minimize optical loss and the thickness of an emitter region may be relatively increased so as to facilitate photoelectric conversion and to improve passivation characteristics. Further, the semiconductor substrate includes only a base region without a doped region and may thus have excellent passivation characteristics. Moreover, by restricting thickness relationships and thickness ratios between a first passivation film and a first transparent electrode layer located on the front surface of the semiconductor substrate and a second passivation film and a second transparent electrode layer located on the rear surface of the semiconductor substrate, and the materials of the front electric field region, the emitter region, the first and second passivation films and the first and second transparent electrode layers, passivation characteristics may be maximized and a current density may be maximized. Thereby, efficiency of the solar cell may be maximized.

Although the example embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell comprising:
a semiconductor substrate;
a first passivation film located on a front surface of the semiconductor substrate;
a second passivation film located on a rear surface of the semiconductor substrate;
a front electric field region located on the first passivation film on the front surface of the semiconductor substrate and being of a same conductivity-type as that of the semiconductor substrate;
an emitter region located on the second passivation film on the rear surface of the semiconductor substrate and being of a conductivity-type opposite that of the semiconductor substrate;
first electrodes conductively connected to the front electric field region; and
second electrodes conductively connected to the emitter region,
wherein a ratio of a thickness of the emitter region to a thickness of the second passivation film is greater than a ratio of a thickness of the front electric field region to a thickness of the first passivation film; and
wherein the thickness of the front electric field region is 1 nm to 10 nm, and the thickness of the emitter region is 3 nm to 15 nm.

2. The solar cell according to claim 1, wherein the thickness of the emitter region is greater than the thickness of the front electric field region.

3. The solar cell according to claim 1, wherein:
an energy bandgap of the front electric field region is greater than an energy bandgap of the semiconductor substrate; and
an energy bandgap of the emitter region is greater than the energy bandgap of the semiconductor substrate.

4. The solar cell according to claim 1, wherein the front electric field region and the emitter region include at least one of doped amorphous silicon, amorphous silicon oxide, amorphous silicon carbide, indium gallium zinc oxide, titanium oxide and molybdenum oxide.

5. The solar cell according to claim 1, wherein at least one of the first and second passivation films includes an intrinsic amorphous silicon layer.

6. The solar cell according to claim 1, wherein the thickness of the second passivation film is equal to or greater than the thickness of the first passivation film.

7. The solar cell according to claim 1, wherein at least one of the emitter region and the front electric field region includes a first part and a second part having a higher doping concentration than that of the first part, and
wherein a thickness of the first part is greater than a thickness of the second part.

8. The solar cell according to claim 1, wherein:
the front electric field region includes a first electric field part located on the first passivation film, and a second electric field part located on the first electric field part and having a higher doping concentration than that of the first electric field part;
the emitter region includes a first emitter part located on the second passivation film, and a second emitter part located on the first emitter part and having a higher doping concentration than that of the first emitter part; and
a ratio of the doping concentration of the second emitter part to the doping concentration of the first emitter part is equal to or greater than a ratio of the doping concentration of the second electric field part to the doping concentration of the first electric field part, and the doping concentration of the first emitter part with a second conductivity-type dopant is equal to or smaller than the doping concentration of the first electric field part with a first conductivity-type dopant.

9. The solar cell according to claim 1, wherein:
at least one of the first electrodes and the second electrodes include a transparent electrode layer and a metal electrode layer located on the transparent electrode layer; and
the transparent electrode layer includes at least one of indium tin oxide (ITO), aluminum zinc oxide (AZO), boron zinc oxide (BZO), indium tungsten oxide (IWO), indium cesium oxide (ICO), and indium titanium tantalum oxide.

10. The solar cell according to claim 9, wherein the transparent electrode layer further includes hydrogen.

11. The solar cell according to claim 1, wherein:
the first electrodes include a first transparent electrode layer formed on the front electric field region, and a first metal electrode layer located on the first transparent electrode layer;
the second electrodes include a second transparent electrode layer formed on the emitter region, and a second metal electrode layer located on the second transparent electrode layer; and
a thickness of the first transparent electrode layer is greater than a thickness of the second transparent electrode layer.

12. The solar cell according to claim 1, wherein:
the semiconductor substrate and the front electric field region are of an n-type; and
the emitter region is of a p-type.

13. The solar cell according to claim 1, wherein first uneven parts and second uneven parts are provided on the front surface of the semiconductor substrate.

14. The solar cell according to claim 13, wherein a mean size of the second uneven parts is smaller than a mean size of the first uneven parts.

15. The solar cell according to claim 1, wherein the thickness of the first passivation film is 1 nm to 5 nm, and the thickness of the second passivation film is 1 nm to 7 nm.

\* \* \* \* \*